(12) United States Patent
Shen et al.

(10) Patent No.: US 10,553,707 B1
(45) Date of Patent: Feb. 4, 2020

(54) FINFETS HAVING GATES PARALLEL TO FINS

(71) Applicant: GLOBALFOUNDRIES INC., Grand Cayman (KY)

(72) Inventors: Yanping Shen, Saratoga Springs, NY (US); Hui Zang, Guilderland, NY (US); Bingwu Liu, Clifton Park, NY (US); Manoj Joshi, Clifton Park, NY (US); Jae Gon Lee, Waterford, NY (US); Hsien-Ching Lo, Clifton Park, NY (US); Zhaoying Hu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/108,152

(22) Filed: Aug. 22, 2018

(51) Int. Cl.
| | |
|---|---|
| *H01L 29/66* | (2006.01) |
| *H01L 21/308* | (2006.01) |
| *H01L 21/8234* | (2006.01) |
| *H01L 29/08* | (2006.01) |
| *H01L 29/78* | (2006.01) |

(52) U.S. Cl.
CPC .... *H01L 29/66795* (2013.01); *H01L 21/3083* (2013.01); *H01L 21/823431* (2013.01); *H01L 21/823456* (2013.01); *H01L 29/0847* (2013.01); *H01L 29/66545* (2013.01); *H01L 29/785* (2013.01)

(58) Field of Classification Search
CPC ............. H01L 29/66795; H01L 29/785; H01L 29/0847; H01L 29/66545; H01L 29/7851; H01L 21/823431; H01L 21/823437; H01L 21/823821; H01L 21/3083; H01L 21/823456; H01L 29/7855; H01L 29/7856; H01L 2029/7858
See application file for complete search history.

(56) References Cited

U.S. PATENT DOCUMENTS

| | | | |
|---|---|---|---|
| 8,440,517 B2* | 5/2013 | Lin | .................... H01L 29/66795 438/197 |
| 9,349,651 B2 | 5/2016 | Kim et al. | |
| 9,373,641 B2 | 6/2016 | Anderson et al. | |
| 9,431,265 B2 | 8/2016 | Cheng et al. | |
| 9,450,072 B2* | 9/2016 | Chou | ................ H01L 29/66545 |
| 9,633,906 B2 | 4/2017 | Cai et al. | |
| 9,741,823 B1 | 8/2017 | Greene et al. | |
| 2014/0001572 A1 | 1/2014 | Bohr et al. | |
| 2015/0108544 A1* | 4/2015 | Ching | ............... H01L 21/82382 257/192 |
| 2015/0214219 A1* | 7/2015 | Cai | ....................... H01L 27/088 257/288 |

(Continued)

*Primary Examiner* — Khiem D Nguyen
(74) *Attorney, Agent, or Firm* — Gibb & Riley, LLC; Francois Pagette (57) ABSTRACT

Methods form devices by patterning a lower layer to form a fin, and forming a sacrificial gate along sidewalls of the fin. Such methods form a mask with cut openings on the sacrificial gate and remove sections of the fin and the sacrificial gate exposed through the cut openings to divide the fin into fin portions and create cut areas between the fin portions. Additionally, these methods remove the mask, epitaxially grow source/drains in the cut areas, replace the sacrificial gate with a gate conductor, and form a gate contact on the gate conductor over a center of the fin portions.

20 Claims, 11 Drawing Sheets

(56) References Cited

U.S. PATENT DOCUMENTS

2015/0364580 A1* 12/2015 Jangjian ............ H01L 29/66795
  257/401
2016/0099181 A1  4/2016 Tung
2017/0040328 A1* 2/2017 Park ................ H01L 21/823828
2017/0148682 A1  5/2017 Basker et al.
2019/0067027 A1* 2/2019 Wang ................. H01L 21/3105

* cited by examiner

FINFETS HAVING GATES PARALLEL TO FINS

BACKGROUND

Field of the Invention

The present disclosure relates to fin-type field effect transistors (FinFETs), and more specifically, to FinFETs that have gates that are parallel to the fins.

Description of Related Art

Integrated circuit devices use transistors for many different functions, and these transistors can take many different forms, from planar transistors, to transistors that use a "fin" style structure. A fin of a fin-type transistor (FinFET) is a thin, long, six-sided shape (that is somewhat rectangular) that extends from, or has a bottom surface that is part of, a substrate; with sides that are longer than they are wide, a top and bottom that have somewhat similar lengths as the sides (but that have widths that are much narrower) and ends that are approximately as tall from the substrate as the width of the sides, but that are only approximately as wide as the top and/or bottom. Rounding and uneven shaping can occur (especially at the corners and top) in such fin structures, and often such structures have a rounded, tapered shape; however, such structures are highly distinguishable from planar devices (even though both types of devices are highly useful).

One issue that occurs during processing of FinFETs is that chemical-mechanical polishing (CMP) dishing can occur in long channel (relatively wide fin) FinFET transistors. More specifically, as fins become wider the shape of the top surface of the fin changes from a long thin rectangle into a more square rectangle; and the center sections of such squarer rectangles can experience more material removal (relative to the edges of the squarer rectangle) during CMP, resulting in a fin top surface shaped like a dish or bowl, rather than a more desirable flat surface (e.g., CMP dishing). This CMP dishing can potentially damage the work function metal (WFM) used in the gate of the FinFET, and such dishing limits the channel length, and can become a design-limiting concern for FinFET devices.

SUMMARY

Various methods herein pattern a fin from a lower layer, and form a sacrificial gate material on the sidewalls of the fin. In some embodiments, the sacrificial gate is formed to extend the same distance from each sidewall of the fin. In other embodiments, the sacrificial gate is formed to extend a first distance from one sidewall of the fin and to extend a second different distance from an opposite sidewall of the fin.

Such methods form a mask with cut openings on the sacrificial gate and remove sections of the fin, the gate insulator material, and the sacrificial gate material exposed through the cut openings to divide the fin into fin portions and create cut areas between the fin portions. The cut areas are formed to have a cut length that is less than a linear length of the fin portions. Additionally, these methods remove the mask, epitaxially grow source/drain material in the cut areas, replace the sacrificial gate with a gate conductor, and form a gate contact material on the gate conductor over a center of the fin portions (equidistant between the cut areas). The gate insulator material and the sacrificial gate material are formed over the fin portions the full linear length of the fin portions; however, the gate contact material is formed over less than the full length of the fin portions.

Such methods form apparatuses herein that include (among other components) one or more groups of fin portions made of a semiconducting material. The fin portions are on (extend from) a lower layer. Each of the groups of fin portions are parallel to the other groups of fin portions.

Within an individual group of fin portions, the fin portions are linearly aligned along a fin centerline. The fin portions have a "first" dimension (e.g., the linear length of the fin portion) and a second dimension perpendicular to the fin centerline (that is sometimes called the fin width). This first dimension is parallel to the fin centerline. The fin portions are separated from one another along the fin centerline by cut areas. The cut areas have a cut length along the fin centerline that is less than the first dimension. Source/drain material (an epitaxially-grown material) is in the cut areas.

Such apparatuses also include a gate insulator material on the fin portions, and a gate conductor material on the gate insulator. The gate conductor extends (in a direction parallel to the second dimension) beyond at least one sidewall of the fin portions by an amount equal to the second dimension.

A dielectric material is between each of the groups of fin portions. The dielectric material electrically insulates the gate conductor material of one of the groups of fin portions from adjacent ones of the groups of fin portions. A gate contact material extends through the dielectric material to the gate conductor material. The gate contact is positioned over the center of the fin portions (equidistant between the cut areas). The gate insulator and the gate conductor run along the sidewalls of the fin portions the full first dimension; however, the gate contact does not extend the full length of the fin portion, and is therefore positioned over less than the first dimension of the fin portion.

In some embodiments, the gate conductor material extends the same distance from each sidewall of the fin portions that is equal to the second dimension. In other embodiments, the gate conductor material extends different amounts from the sidewalls of the fin portions.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, chemical-mechanical polishing (CMP) dishing can occur in long channel (relatively wide fin) FinFET transistors, which can potentially be a design-limiting concern for FinFET devices. More specifically, the channel length of a FinFET is the distance between the source/drain regions. When the source/drain structures are adjacent the relatively longer "sidewalls" of the fin, the fin is made wider to form a longer channel region. However, this additional fin width (without any change in fin length) creates a more square rectangle area at the top of the fin, the center of which is relatively more affected by polishing processes, resulting in dishing at the top of such wider, squarer fins.

The structures and methods herein address such issues by forming FinFETs that have source/drain regions in the cut areas of the fin (the source/drain regions are at the relatively shorter "ends" of the fin portions) and gates that are parallel to the sidewalls of the fins (the gates run along the sidewalls of the fin portions). Placing the source/drain regions at the ends of the fin portions allows the channel length to run along the midline of the fin, which produces a relatively long channel without widening the fin, and this avoids the dishing that can occur when the fin is made wider.

In other words, such long channel FinFET transistor structures have the gate (PC) and the fin running in the same direction (parallel to the fin midline), where the epitaxially grown source/drain is positioned in the gate cut (CT) region at the ends of the fin portions, and the gate contact (CB) is centered above the middle of gate and fin (e.g., centered between the source and drain or ends of the fin portions). By positioning the source/drain regions in the cut areas at the ends of the fin portions and forming the gates along the sidewalls of the fins, the channel length is increased without increasing the width of the fin, and this allows longer channel lengths without the dishing that CMP can produce in wider, squarer fins.

Figure 1:
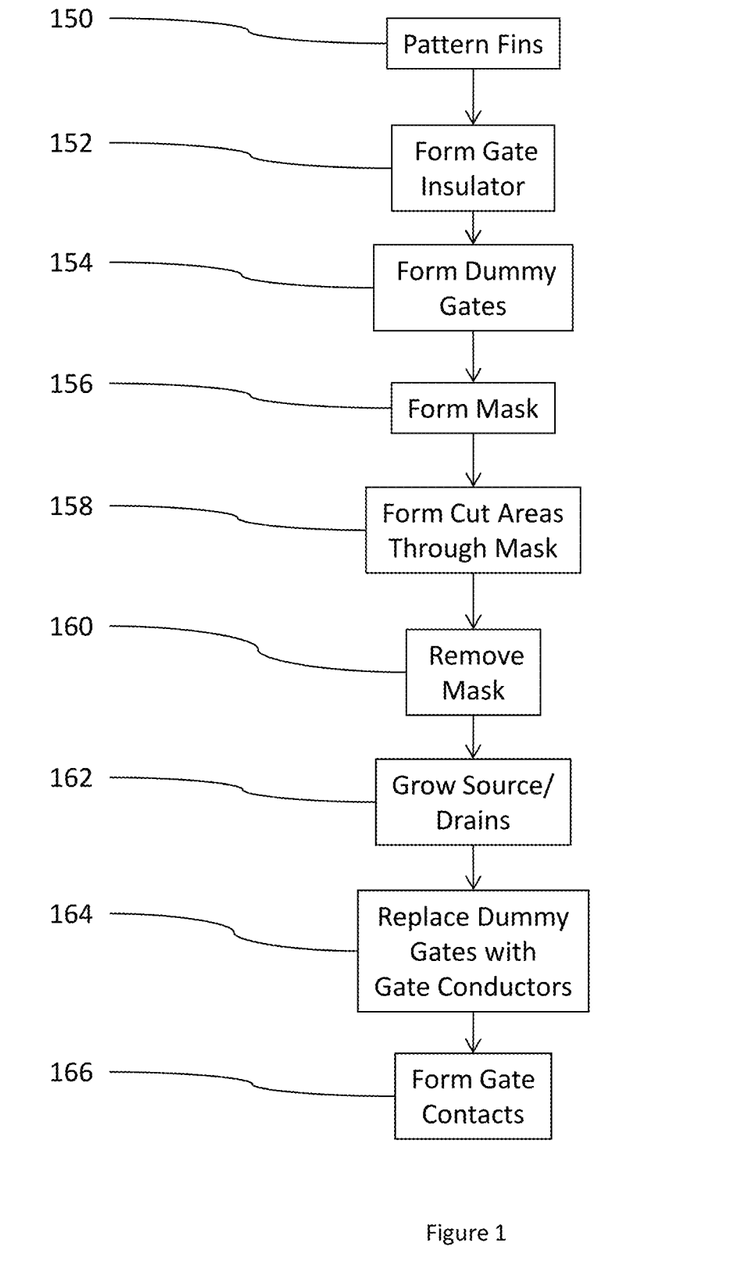
FIG. 1 is a flow diagram illustrating embodiments herein.

FIG. 1 is a flowchart illustrating some aspects of methods herein. As shown in FIG. 1, in item 150, methods herein pattern a fin on a lower layer. In item 152, these methods form a gate insulator material on the fin. While the gate insulator is shown as being formed in item 152, it can be formed later in processing, such as just before formation of the replacement metal gates in item 164 discussed below.

In item 154, such methods form a sacrificial gate material on the gate insulator to extend a certain distance from sidewalls of the fin so as to create sacrificial (or "dummy") gates that are parallel to the fins, instead of intersecting the fins. The dummy gates may be very thin and only extend from the fin or gate insulator a distance (thickness) equal to the fin width. In some embodiments, the sacrificial gate material is formed in item 154 to extend the same distance from each sidewall of the fin portions. In other embodiments, the sacrificial gate is formed in item 154 to extend a first distance from one sidewall of the fin portions and to extend a second different distance from an opposite sidewall of the fin portions.

In item 156, such methods form a mask with cut openings on the sacrificial gate material. In item 158, these methods remove sections of the fin, the gate insulator material, and the sacrificial gate material exposed through the cut openings to divide the fin into fin portions and create cut areas between the fin portions. The cut areas are formed in item 158 to have a cut length that is less than a linear length of the fin portions.

The mask is removed in item 160. Additionally, in item 162, these methods epitaxially grow source/drain material in the cut areas. The sacrificial gate material is selectively removed and replaced with a gate conductor material in item 164. In item 166, these methods form a gate contact material on the gate conductor material over the center of the fin portions (equidistant between the cut areas). The gate insulator material and the sacrificial gate material are formed over the fin portions the full linear length of the fin portions in items 152 and 154; however, the gate contact material is formed over less than the full length of the fin portions in item 166.

This processing is also shown in FIGS. 2A-11C, discussed below. More specifically, the A Figures of FIGS. 2A-11A are top (plan) view conceptual schematic diagrams and the B and C Figures of FIGS. 2B-11C are cross-sectional views of conceptual schematic diagrams, respectively along lines X1-X1 and X2-X2 in the A Figures, of various apparatuses formed according to methods herein.

Figure 2A:
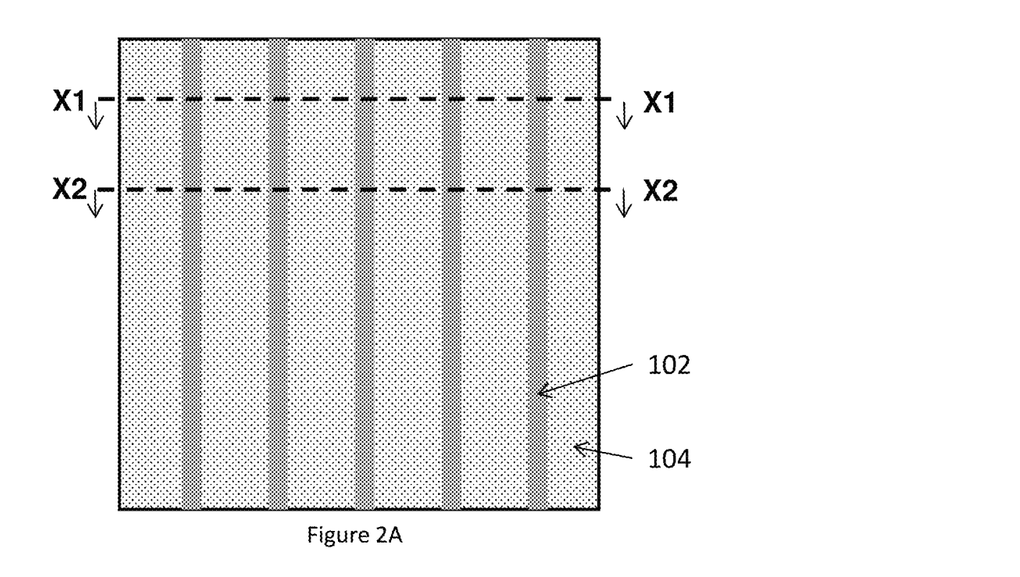
FIG. 2A is a top (plan) view of a conceptual schematic diagram of an apparatus formed according to methods herein.
Figure 2B:
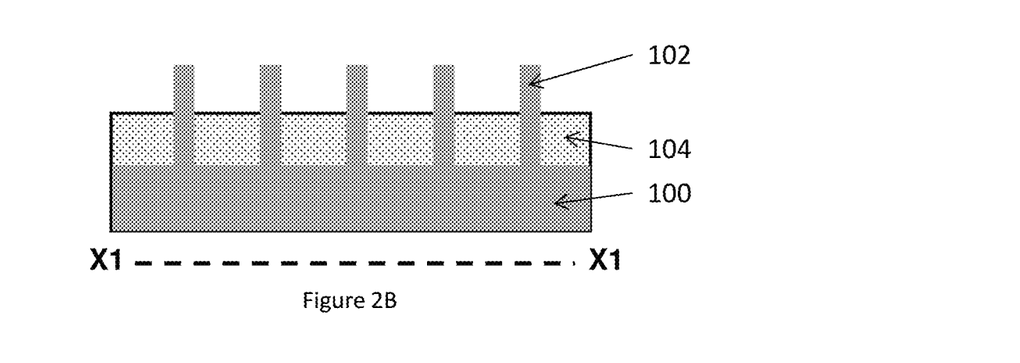
FIGS. 2B and 2C are cross-sectional views of conceptual schematic diagrams, respectively along lines X1-X1 and X2-X2 shown in FIG. 2A, of an apparatus formed according to methods herein.
Figure 2C:
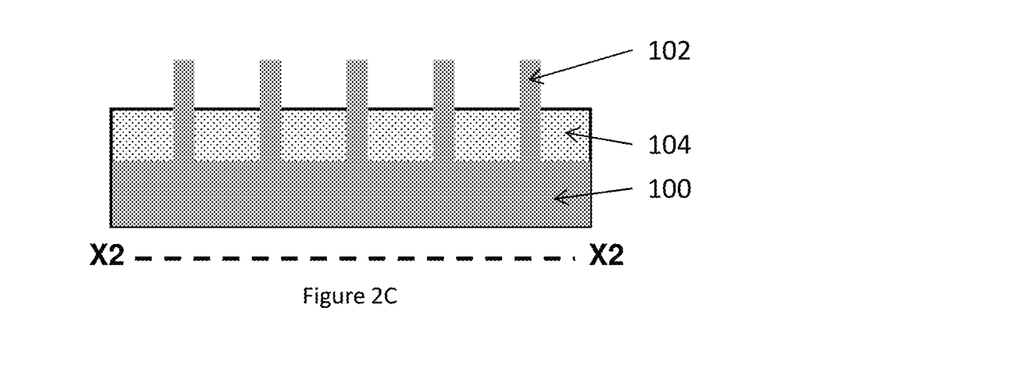

As shown in FIGS. 2A-2C, this processing patterns one or more fins to extend from (e.g., on) a lower layer 104. In greater detail, such processing can pattern a substrate 100 to form at least two laterally adjacent parallel fins 102 extending from the same material (substrate 100). The fins 102 can be patterned using many different methods, such as patterning using sidewall spacer processing.

More specifically, in such processing a silicon layer 100 (which may be in situ doped or undoped at this point in processing and is sometimes referred to as a substrate) is deposited on an underlying layer (such as a wafer or buried oxide layer). Also, a protective cap layer can be formed (deposited or grown) on the silicon layer. Mandrels are patterned on the protective cap layer.

In patterning processes herein material to be patterned, such as the silicon layer and the protective cap layer, can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then, one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off)). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

Therefore, mandrels of a sacrificial material can be patterned using a resist and etching, and sidewall spacers can be grown on the mandrels. For purposes herein, "sidewall spacers" are structures that are generally formed by depositing or growing a conformal layer, and then performing a directional (anisotropic) etching process that etches material from horizontal surfaces at a greater rate than it removes material from vertical surfaces, thereby leaving insulating material along the vertical sidewalls of structures. This material left on the vertical sidewalls is referred to as sidewall spacers.

The mandrels are removed in a selective removal process (e.g., wet or dry processing) that allows the protective cap layer and sidewall spacers to remain. A material removal process is then used to transfer the pattern of the sidewall spacers through the protective cap layer and partially through the silicon layer 100 (to leave fins 102 of silicon extending from the substrate 100 of silicon). This forms parallel fins 102 that are of uniform size (uniform length, width, and height) and uniformly spaced. Such processing is controlled (time control, power control, etc.) to limit the amount of silicon layer 100 removed, and to not etch completely through the silicon material 100. The sidewall spacers are removed in a selective removal process (e.g., wet processing) that allows the fins 102 to remain (potentially with a protective cap layer, both of which are represented in the drawings by element 102).

Such processing also forms an isolation layer 104 on the substrate 100 to partially cover the fins 102. More specifically, an isolation material (e.g., low-k material) 104 is deposited over the fins. Then, a fin reveal process is performed in which the isolation material 104 is removed in a selective removal process (that does not affect the protective cap layer or fins 102) to reduce the height of the isolation material 104 above the silicon layer 100 to allow a portion of the fins 102 to extend from the isolation material 104. Such processing is controlled (time control, power control, etc.) to limit the amount of isolation material 104 removed, and not completely remove the isolation material 104.

Such methods can dope the exposed portions of the fins 102 with impurities to form similarly or differently doped fins. For example, one group of fins could be heavily doped, while another group could be more lightly doped, or another group could be oppositely doped, etc. During such doping, some fins may be protected with a mask while other fins are doped. Also, those ordinarily skilled in the art would understand the fins 102 could be doped at many different points in the processing, and this processing sequence arbitrarily shows doping occurring at this point.

In one example different groups of fins could be doped with opposite impurities so as to form groups of complementary transistors adjacent one another. For example, a positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region. Again, these are only examples, and different dopants could be used for different types of transistors.

Figure 3A:
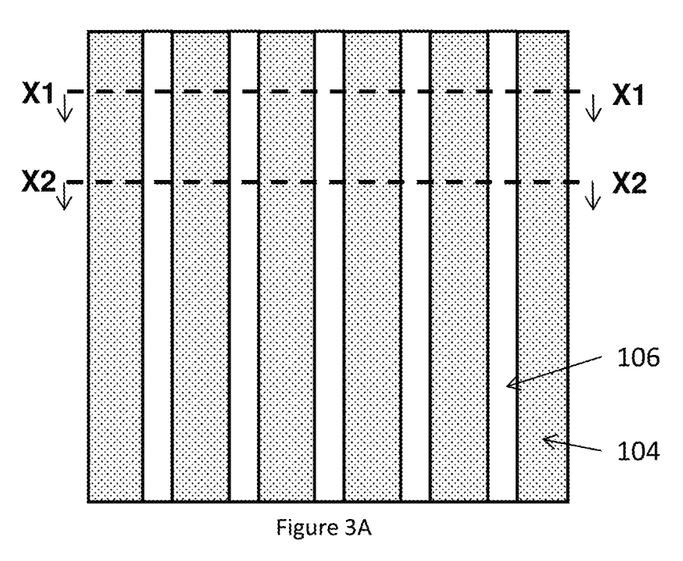
FIG. 3A is a top (plan) view of a conceptual schematic diagram of an apparatus formed according to methods herein.
Figure 3B:
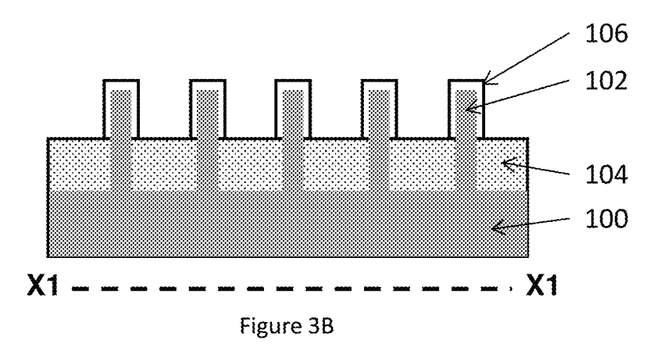
FIGS. 3B and 3C are cross-sectional views of conceptual schematic diagrams, respectively along lines X1-X1 and X2-X2 shown in FIG. 3A, of an apparatus formed according to methods herein.
Figure 3C:
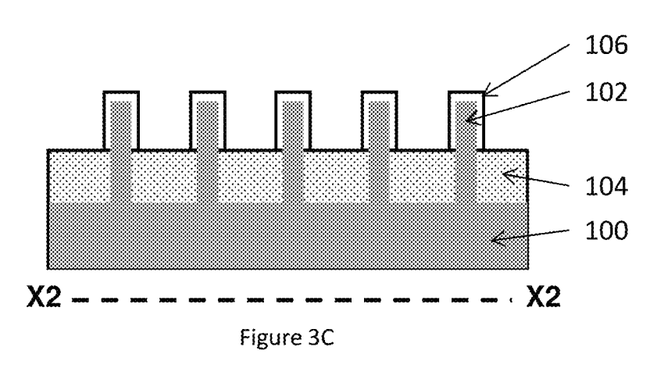

As shown in FIGS. 3A-3C, a gate insulator material 106 (e.g., a transistor "gate oxide") can be formed on the fin, or such gate oxide can be formed later in processing, such as when the replacement metal gate (gate conductor) is formed. The gate insulator material 106 can be formed of multiple layers of materials, such as silicon dioxide ($SiO_2$), or other similar oxides that can be deposited, flowed, grown, etc.; or high-k materials including but not limited to silicon nitride, silicon oxynitride, a gate dielectric stack of $SiO_2$ and $Si_3N_4$, and metal oxides like tantalum oxide, etc., can be used. The thickness of dielectrics herein may vary contingent upon the required device performance.

Figure 4A:
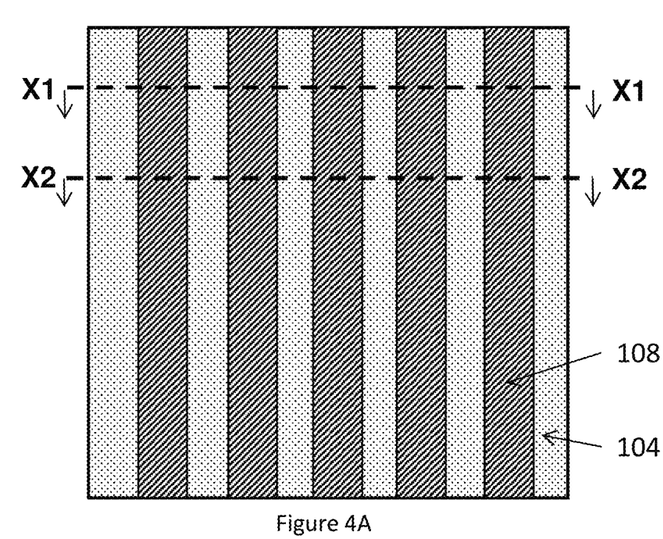
FIG. 4A is a top (plan) view of a conceptual schematic diagram of an apparatus formed according to methods herein.
Figure 4B:
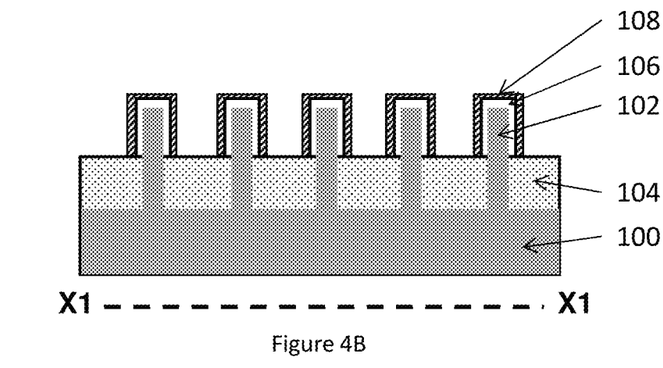
FIGS. 4B and 4C are cross-sectional views of conceptual schematic diagrams, respectively along lines X1-X1 and X2-X2 shown in FIG. 4A, of an apparatus formed according to methods herein.
Figure 4C:
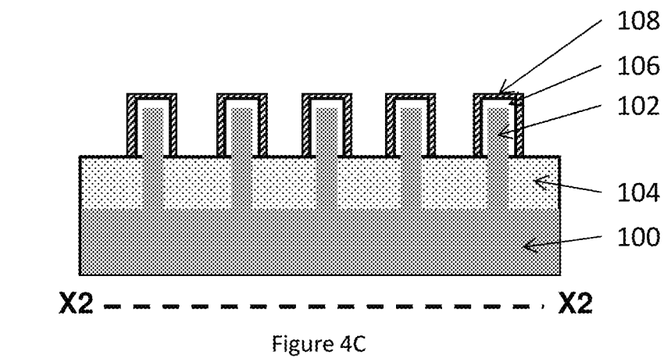

In FIGS. 4A-4C, this processing forms a sacrificial gate material 108 on the gate insulator 106 to extend a certain distance measured from sidewalls of the fins 102 so as to create sacrificial (or "dummy") gates that are parallel to the fins, instead of intersecting the fins. The dummy gates may be very thin and only extend from the fin or gate insulator a distance (thickness) equal to the fin width. Such sacrificial gate material 108 may include multiple layers of work function metal layers. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

In some embodiments, the sacrificial gate material 108 is formed to have an outer surface (or outer sidewall) that is on the intervening gate insulator 106 and is positioned the same distance from each sidewall of the fin portions 102A, 102B, as shown in FIGS. 4B and 4C. In other embodiments, the sacrificial gate 108 can cover multiple fins 102. The dummy gates 108 may be very thin and only extend from the sidewalls of the the fin 102 or gate insulator 106 a distance (thickness) equal to the fin width.

Such dummy gates 108 can be created by forming (depositing) a thin conformal layer of sacrificial material 108 (e.g., polysilicon, amorphous silicon, or any other suitable sacrificial gate material that is selectively removable from the semiconductor materials) and then performing a directional (anisotropic) etching process that etches material from horizontal surfaces at a greater rate than it removes material from vertical surfaces, thereby leaving the sacrificial material 108 along the vertical sidewalls of the gate insulator 106 on the fins 102. In other processing, after deposition on the gate insulator 106, the sacrificial gate material 108 can be selectively patterned from between the fins 102 using masking and etching, as discussed above. Such processing can remove the sacrificial material 108 from the planar surface of the isolation material 104 between the gate insulator 106 of some or all laterally adjacent fins 102. Depending upon the processing used, the sacrificial gate material 108 may, or may not, remain on the top surfaces (distal to the substrate 100) of the fins 102. Thus, in the embodiment shown in FIGS. 4A-4C, the sacrificial gate material 108 can be only on the sidewalls of each fin 102 (or on the gate insulator 106 if present on the sidewalls of the fins 102) and can be electrically isolated from the sacrificial gates 108 of immediately laterally adjacent fins 102. Again, in other embodiments, the sacrificial gate 108 can be continuous across, and cover, the sidewalls and tops of multiple fins 102.

Figure 5A:
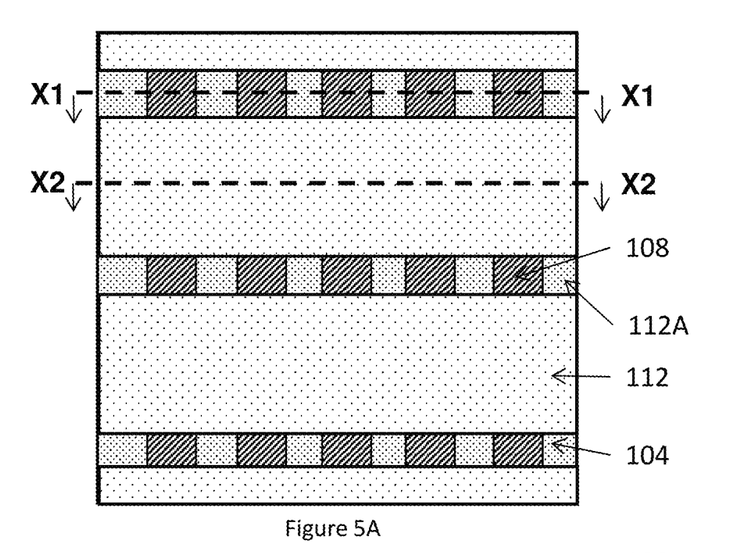
FIG. 5A is a top (plan) view of a conceptual schematic diagram of an apparatus formed according to methods herein.
Figure 5B:
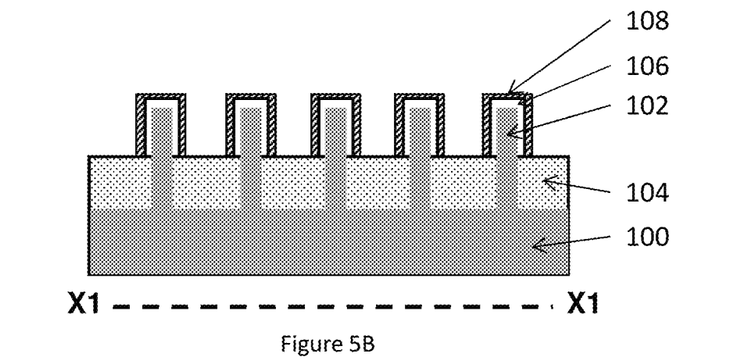
FIGS. 5B and 5C are cross-sectional views of conceptual schematic diagrams, respectively along lines X1-X1 and X2-X2 shown in FIG. 5A, of an apparatus formed according to methods herein.
Figure 5C:
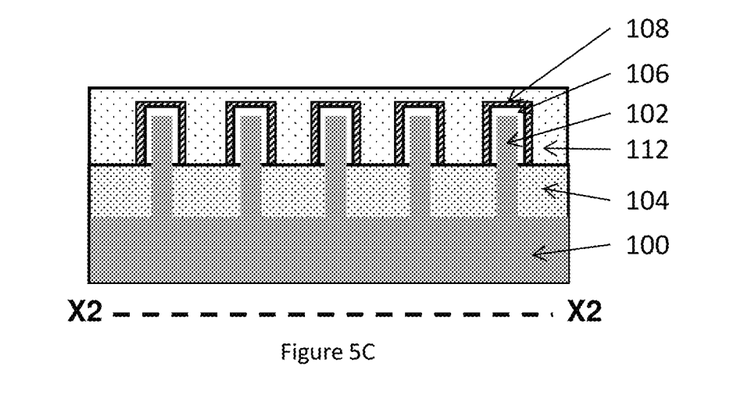
Figure 6A:
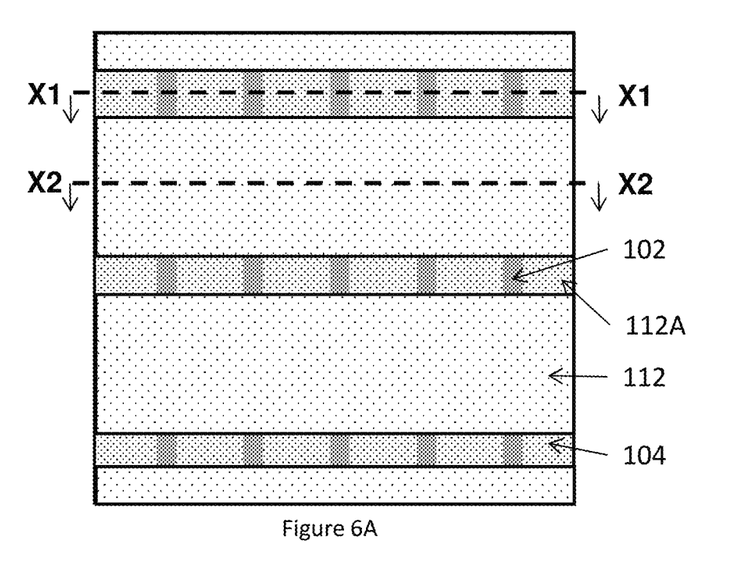
FIG. 6A is a top (plan) view of a conceptual schematic diagram of an apparatus formed according to methods herein.

As shown in FIGS. 5A-5C, such processing forms a mask 112 with cut openings in locations 112A on the sacrificial gate material 108. With the mask 112 in place, such processing removes sections of the fins 102, the gate insulator material 106, and the sacrificial gate material 108 exposed through the location 112A of the cut openings to divide the fin 102 into fin portions 102A, 102B and create cut areas (in location 112A) between the fin portions 102A, 102B, as shown in FIGS. 6A-6B.

Figure 6B:
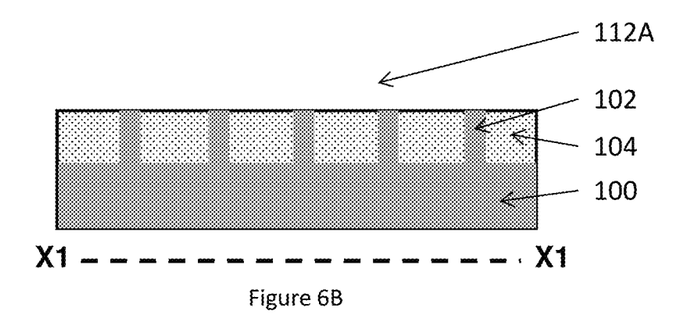
FIGS. 6B and 6C are cross-sectional views of conceptual schematic diagrams, respectively along lines X1-X1 and X2-X2 shown in FIG. 6A, of an apparatus formed according to methods herein.
Figure 6C:
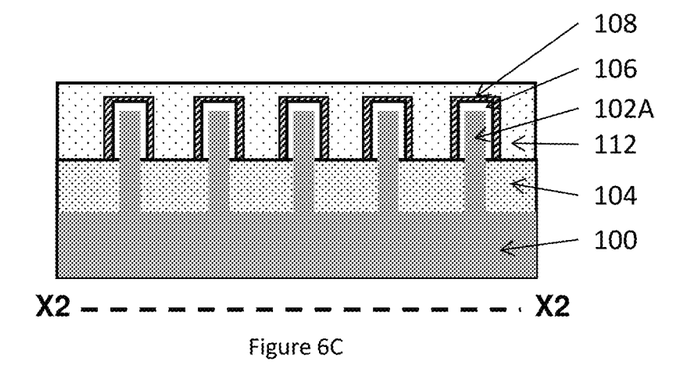

Note that FIG. 6B shows a cross-section of a cut area 112A where the tops of the fins 102 have been reduced in height to be the same height (thickness) as the top surface of the isolation material 104 (e.g., where the tops of fins 102 form a co-planar surface with the top of the isolation material 104, and where the "top" is the surface opposite the unpatterned portion of the substrate 100). However, because the cross-section in FIG. 6C shows one of the fin portions 102A that is not affected by the fin cutting performed in FIGS. 6A-6C, the previously formed structures are in place. Such cut areas (112A) are formed to have a "cut length" between ends of adjacent fin portions that is less than a linear length of the fin portions 102A, 102B (in other words, the cut areas (112A) are shorter than the fin portions 102A, 102B).

Figure 7A:
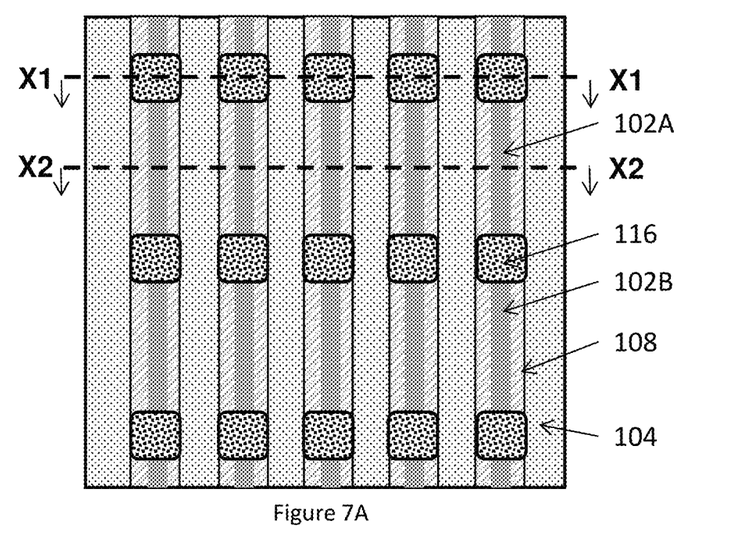
FIG. 7A is a top (plan) view of a conceptual schematic diagram of an apparatus formed according to methods herein.
Figure 7B:
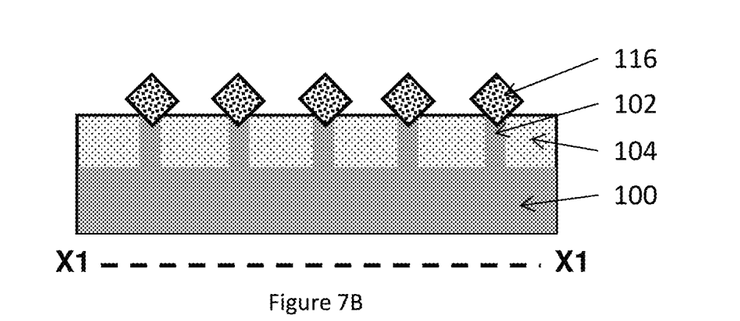
FIGS. 7B and 7C are cross-sectional views of conceptual schematic diagrams, respectively along lines X1-X1 and X2-X2 shown in FIG. 7A, of an apparatus formed according to methods herein.
Figure 7C:
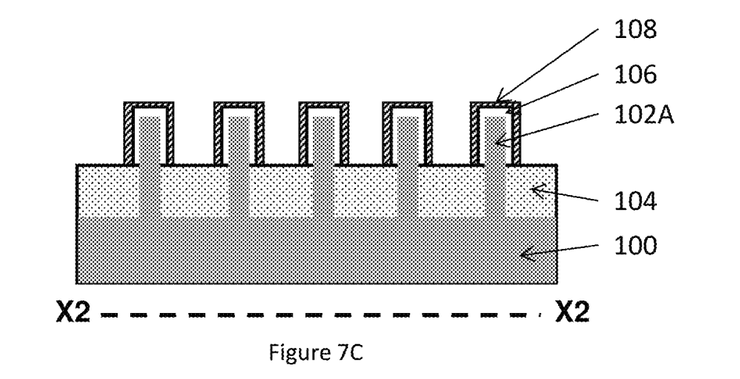

FIGS. 7A-7C show the structure after this processing removes the mask 112, revealing distinct fin portions 102A, 102B. The processing in FIGS. 7A-7C illustrates that this processing also epitaxially grows source/drain material 116 from or on only the exposed portions of the fins 102 in the location 112A of the cut areas. Epitaxial growth occurs in a heated (and sometimes pressurized) environment that is rich with a gas of the material that is to be grown. Note that the illustrations following FIG. 7A show the sacrificial gate material 108 in a transparent view to allow the position of the underlying fin portions 102A, 102B to be more easily seen.

Figure 8A:
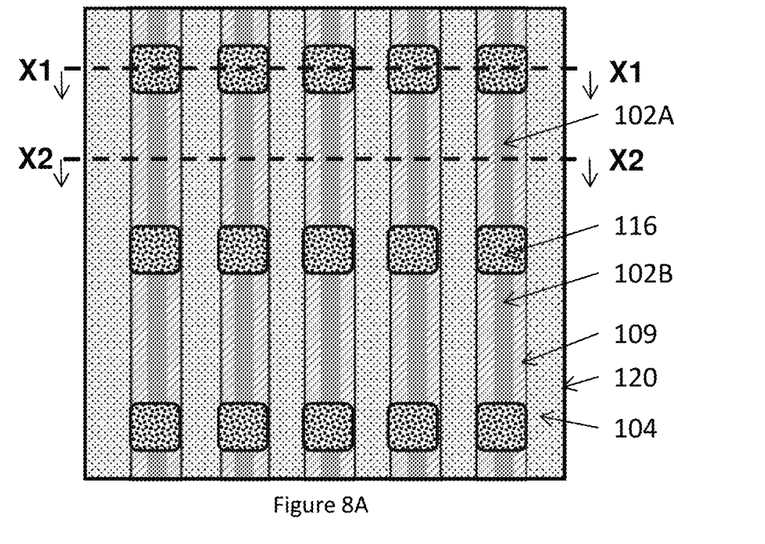
FIG. 8A is a top (plan) view of a conceptual schematic diagram of an apparatus formed according to methods herein.
Figure 8B:
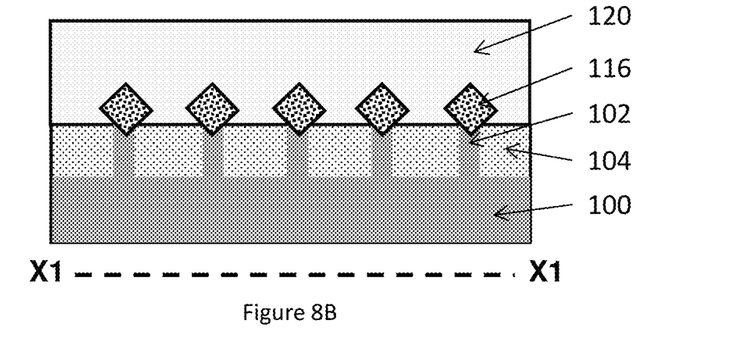
FIGS. 8B and 8C are cross-sectional views of conceptual schematic diagrams, respectively along lines X1-X1 and X2-X2 shown in FIG. 8A, of an apparatus formed according to methods herein.
Figure 8C:
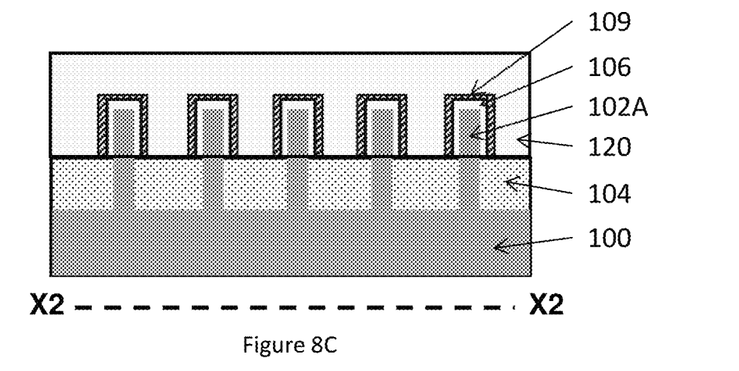

FIGS. 8A-8C show that such processing replaces the sacrificial gates 108 with conductors to form gate conductors 109, which can be for example high-K/metal gates (HKMG), replacement metal gates (RMG), etc. More specifically, this processing removes the sacrificial gate material 108 in a selective material removal process that does not affect other exposed materials, and this leaves recesses where the sacrificial gates 108 were located. The recesses can be lined (conformal deposition, growth processes, etc.) with a thin insulator to form the gate insulator 106, if such was not previously formed. Such recesses are then filled in with the gate conductor material 109 (conformal deposition, etc.) to allow the gate conductors 109 to have the same shape, size, and location as the sacrificial gates 108. Therefore, as with the sacrificial gates 108, the gate conductors 109 can be only on the sidewalls of each fin 102 (or on the gate insulator 106 on the sidewalls of the fins 102) and can be electrically isolated from the gate conductors 109 of immediately laterally adjacent fins 102. Again, in other embodiments, the gate conductors 109 can be continuous across, and cover, the sidewalls and tops of multiple fins 102.

Further, the processing shown in FIGS. 8A-8C forms (e.g., deposits or grows) a dielectric layer 120 (of any of the insulators mentioned herein). Note that the illustrations following FIG. 8A show the dielectric layer 120 in a transparent view to allow the underlying structures to be more easily seen.

Figure 9A:
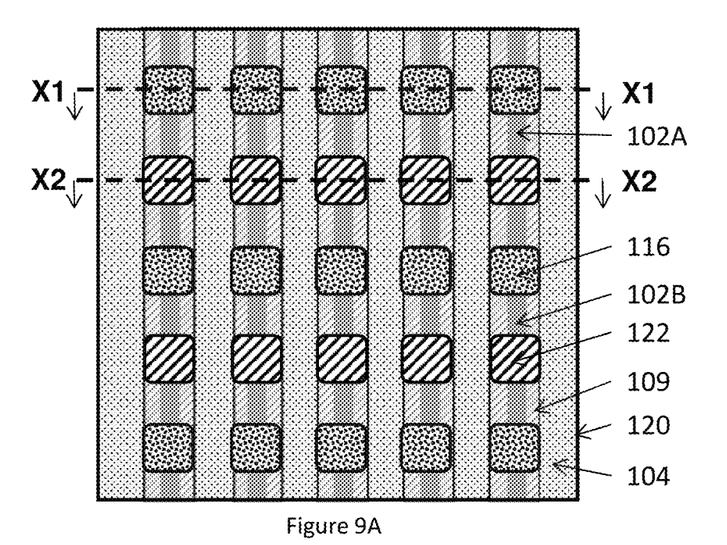
FIG. 9A is a top (plan) view of a conceptual schematic diagram of an apparatus formed according to methods herein.
Figure 9B:
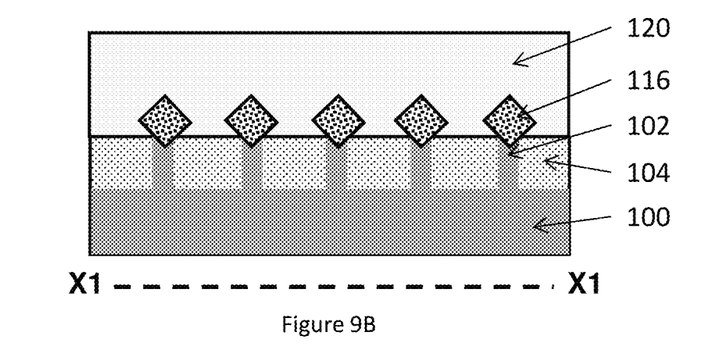
FIGS. 9B and 9C are cross-sectional views of conceptual schematic diagrams, respectively along lines X1-X1 and X2-X2 shown in FIG. 9A, of an apparatus formed according to methods herein.
Figure 9C:
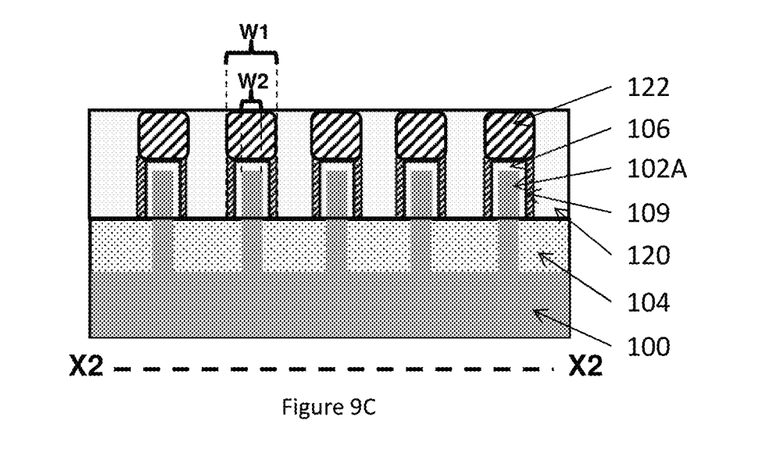

As shown in FIGS. 9A-9C, such processing patterns openings in the dielectric layer 120 over the centers of the fin portions 102A, 102B (e.g., using masking and etching, etc.), and fills such openings with a conductor (of any of the conductors mentioned herein) to form a gate contact material 122 extending completely through the dielectric layer 120 to the gate conductor material 109.

As shown in FIG. 9A, in some embodiments, such processing forms the gate contact material 122 only over the center of the fin portions 102A, 102B (e.g., where the "center" is equidistant between the location 112A of the cut areas). Therefore, as shown in FIGS. 9A-9C, the gate insulator material 106 and the gate conductor material 109 are formed over the full linear length of each fin portion 102A, 102B; however, the gate contact material 122 is formed over less than the full length of the fin portions 102A, 102B, and only over the center of the fin portions 102A, 102B.

Thus, as shown in FIGS. 9A-9C, in some embodiments, the gate conductor material 109 is formed to extend the same distance from each sidewall of the fin portions 102A, 102B (as shown by the difference of width W1 compared to width W2). Thus, the gate conductors 109 may be very thin and only extend from the fin 102 or gate insulator 102 a distance (thickness) equal to the fin width (W2), where in such an example W1 would be three times as wide as W1. In other examples the thickness of the gate conductors 109 over the fin 102 sidewalls can be thicker, but can be thin enough to not contact immediately laterally adjacent gate conductors 109 on laterally adjacent fins 102.

Figure 10A:
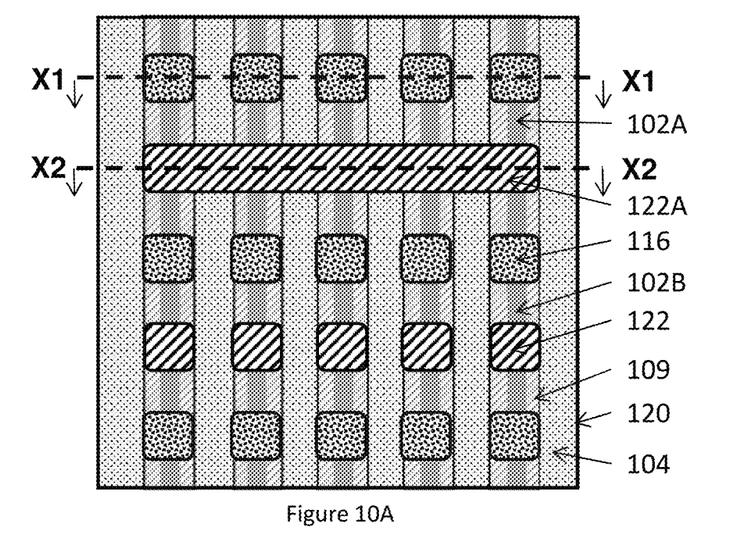
FIG. 10A is a top (plan) view of a conceptual schematic diagram of an apparatus formed according to methods herein.
Figure 10B:
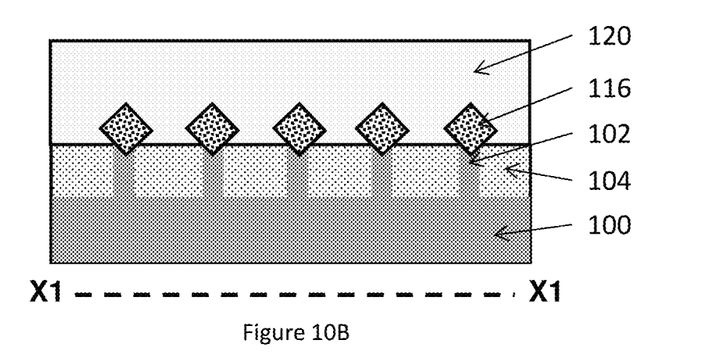
FIGS. 10B and 10C are cross-sectional views of conceptual schematic diagrams, respectively along lines X1-X1 and X2-X2 shown in FIG. 10A, of an apparatus formed according to methods herein.
Figure 10C:
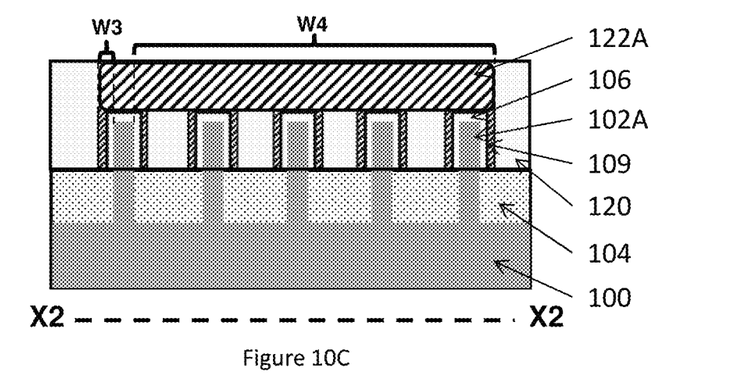

In other embodiments, as shown in FIG. 10A-10C, the patterning of holes in the dielectric layer 120 forms the gate contact material 122A to extend across multiple fin portions 102A (see FIGS. 10A and 10C). Thus, in such embodiments, the outer sidewalls of the gate contact material 122A is positioned a larger first distance (W4) from one sidewall of the fin portions 102A, 102B and to extend a second different distance (smaller distance W3) from an opposite sidewall of the fin portions 102A, 102B.

Figure 11A:
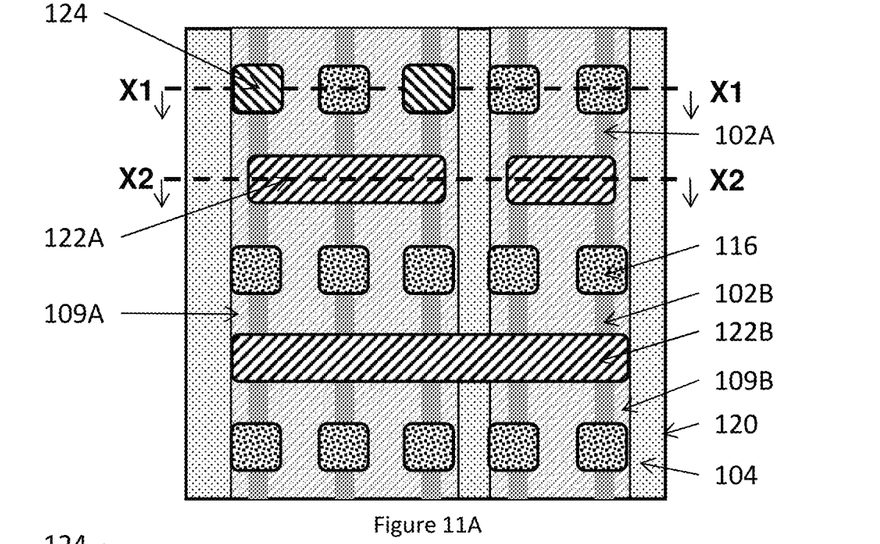
FIG. 11A is a top (plan) view of a conceptual schematic diagram of an apparatus formed according to methods herein.
Figure 11B:
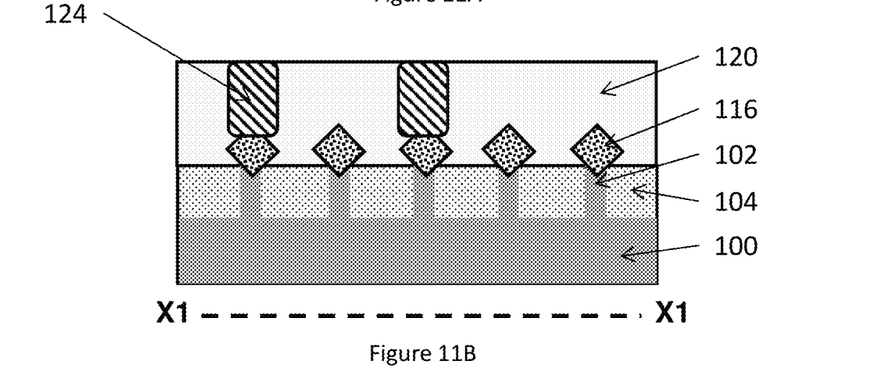
FIGS. 11B and 11C are cross-sectional views of conceptual schematic diagrams, respectively along lines X1-X1 and X2-X2 shown in FIG. 11A, of an apparatus formed according to methods herein.
Figure 11C:
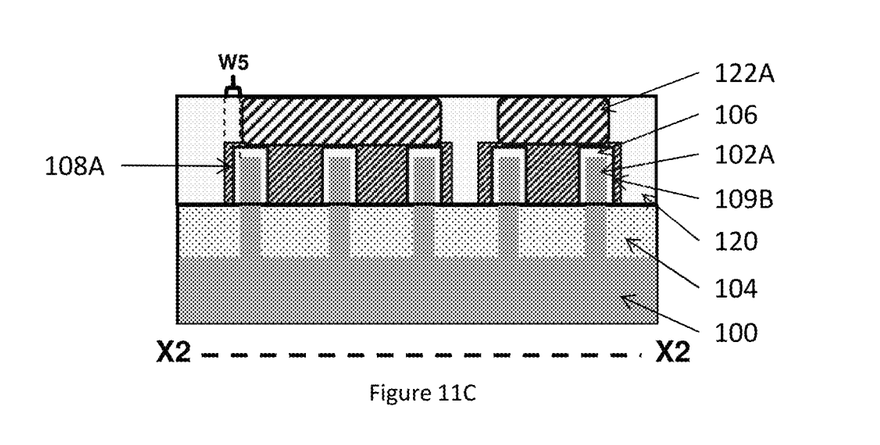

FIGS. 11A-11C show additional alternative embodiments where the patterning of the gate conductor material (in FIGS. 4A-4C) forms potentially differently sized (or uniformly sized) gate conductors 109A, 109B that can extend over multiple fin portions 102. Therefore, FIGS. 11A and 11C illustrate that the gate conductor material 109 can be formed to extend a first distance from one sidewall of the fin portions 102A and to extend a second different distance from an opposite sidewall of the fin portions 102A. FIGS. 11A and 11B also illustrates that some source/drain contacts 124 can be formed through the dielectric layer 120, using the processing described above.

Note that, in contrast to the structure shown in FIG. 9C where the gate contact material 122 has the same size (width W1) as the gate conductor material 109, as shown in FIGS. 11A and 11C the gate contact material 122 can alternatively be formed in this processing have a different size (width W5) than the gate conductor material 109. Thus, as shown in FIG. 11A, in processing herein some of the gate contact materials 122A can be formed to be more narrow than the sidewalls of the gate conductors 109A, 109B, and be centered between the sidewalls of the gate conductors 109A, 109B; while in other processing herein, the gate contact materials 122B can be formed to have sidewalls aligned with sidewalls of the gate conductor 109A, 109B (FIG. 9C).

Therefore, as shown in FIGS. 9A-11C, such processing form apparatuses herein that include (among other components) one or more groups of linearly aligned fin portions 102A, 102B made of, or doped to become, a semiconducting material. The fin portions 102A, 102B are on (or extend from) a lower layer 100 or 104. Each of the groups of linearly aligned fin portions 102A, 102B are parallel to the other groups of linearly aligned fin portions 102A, 102B.

Each "group" of fin portions 102A, 102B were originally a single fin 102. Therefore, within each individual group of fin portions 102A, 102B, the fin portions 102A, 102B are linearly aligned along a fin centerline (e.g., the centerline of the original fin 102). The fin portions 102A, 102B have a "first" dimension (e.g., the linear length of the fin portion) and a second dimension perpendicular to the fin centerline (that is sometimes called the fin width, cross-fin distance).

The fin portions 102A, 102B are separated from one another along the fin centerline by the cut areas 112A. The cut areas have a "cut length" between adjacent ends of the fin portions 102A, 102B along the fin centerline (defined by the openings in the mask 112) that is less than the first dimension of the fin portions 102A, 102B. Source/drain structures 116 (an epitaxially-grown material) are positioned in the cut areas 112A between the fin portions 102A, 102B within each group.

Such apparatuses also include a gate oxide (insulator) 106 on the fin portions 102A, 102B, and a gate conductor 109 on the gate insulator 106. The gate conductor 109 extends (parallel to the second dimension) beyond at least one sidewall of the fin portions 102A, 102B by a cross-fin thickness that can be as thin as the second dimension. Therefore, the gate conductors 109 are parallel to the fins 102, and run along the fin 102 sidewalls instead of intersecting the fins 102.

A dielectric 120 can be positioned between one or more of the groups of fin portions 102A, 102B. The dielectric 120 electrically insulates the gate conductors 109 of laterally adjacent groups of fin portions 102A, 102B. A gate contact 122 extends through the dielectric 120 to the gate conductor 109. The gate contact 122 is positioned over the center of the fin portions 102A, 102B (equidistant between the cut areas). FIGS. 9A-11C also show that the gate insulator 106 and the gate conductor 109 run along the sidewalls of the fin portions 102A, 102B the full first dimension; however, the gate contacts 122, 122A, 122B do not extend the full length of the fin portions 102A, 102B, and are therefore positioned over less than the first dimension of the fin portions 102A, 102B. Additionally, in some embodiments, both sidewalls of the gate conductor 109 can extend the same distance from each sidewall of the fin portions 102A, 102B that can be as thin as the cross-fin dimension (FIGS. 9A and 9C); while in other embodiments, the sidewalls of the gate conductor 109 can extend different amounts from the sidewalls of the fin portions 102A, 102B.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed (grown or deposited) from any of the many candidate low dielectric constant materials (low-K (where K corresponds to the dielectric constant of silicon dioxide) materials such as fluorine or carbon-doped silicon dioxide, porous silicon dioxide, porous carbon-doped silicon dioxide, spin-on silicon or organic polymeric dielectrics, etc.) or high dielectric constant (high-K) materials, including but not limited to silicon nitride, silicon oxynitride, a gate dielectric stack of $SiO_2$ and $Si_3N_4$, hafnium oxide ($HfO_2$), hafnium zirconium oxide ($HfZrO_2$), zirconium dioxide ($ZrO_2$), hafnium silicon oxynitride (HfSiON), hafnium aluminum oxide compounds ($HfAlO_x$), other metal oxides like tantalum oxide, etc. The thickness of dielectrics herein may vary contingent upon the required device performance.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by growing or filling with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present embodiments has been presented for purposes of illustration and description but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. An apparatus comprising:
   fin portions aligned along a fin centerline, wherein the fin portions are separated along the fin centerline by cut areas;
   gate insulators on at least sidewalls of the fin portions;
   gate conductors on the gate insulators, wherein the gate conductors are positioned only along the sidewalls of the fin portions between the cut areas;
   a gate contact on the gate conductors, wherein the gate contact is positioned over a center of the fin portions; and
   source/drain structures in the cut areas.

2. The apparatus according to claim 1, wherein the gate conductors extend a distance from each sidewall of the fin portions equal to a width of the fin portions.

3. The apparatus according to claim 1, wherein the gate conductors extend a first distance from one sidewall of the fin portions and extend a second distance from an opposite sidewall of the fin portions.

4. The apparatus according to claim 1, wherein the cut areas have a cut length along the fin centerline, and wherein the cut length is less than a width of the fin portions.

5. The apparatus according to claim 1, wherein the gate insulators and the gate conductors are over a full amount of the fin portions, and wherein the gate contact is over less than the full amount of the fin portions.

6. The apparatus according to claim 1, wherein the center of the fin portions is equidistant between the cut areas.

7. The apparatus according to claim 1, wherein the source/drain structures are an epitaxially-grown material.

8. An apparatus comprising:
groups of fin portions of semiconductor material on a lower layer, wherein the groups of fin portions are parallel to one another, wherein fin portions within each of the groups of fin portions are aligned along a fin centerline, wherein the fin portions have a first dimension parallel to the fin centerline and a second dimension perpendicular to the fin centerline, wherein the fin portions are separated from one another along the fin centerline by cut areas;
a gate insulator material on the fin portions;
a gate conductor material on the gate insulator material, wherein the gate conductor material extends beyond at least one sidewall of the fin portions by an amount equal to the second dimension, and wherein the gate conductor material is positioned only along the sidewalls of the fin portions between the cut areas;
a gate contact material on the gate conductor material, wherein the gate contact material is positioned over a center of the fin portions; and
source/drain material in the cut areas.

9. The apparatus according to claim 8, further comprising a dielectric material between each of the groups of fin portions, wherein the gate conductor material extends a distance from each sidewall of the fin portions equal to the second dimension, and wherein the dielectric material electrically insulates gate conductor material of one of the groups of fin portions from adjacent ones of the groups of fin portions.

10. The apparatus according to claim 8, further comprising a dielectric material between some of the groups of fin portions, wherein the gate conductor material extends a distance from a sidewall of the fin portions of at least one of the groups of fin portions equal to the second dimension.

11. The apparatus according to claim 8, wherein the cut areas have a cut length along the fin centerline, and wherein the cut length is less than the first dimension.

12. The apparatus according to claim 8, wherein the gate insulator material and the gate conductor material are over the fin portions a full amount of the first dimension, and wherein the gate contact material is over the fin portions less than the full amount of the first dimension.

13. The apparatus according to claim 8, wherein the center of the fin portions is equidistant between the cut areas.

14. The apparatus according to claim 8, wherein the source/drain material is an epitaxially-grown material.

15. An apparatus comprising:
a fin extending from a substrate, wherein the fin has fin portions and cut areas, wherein the fin portions are aligned along a fin centerline, wherein the fin portions are separated along the fin centerline by the cut areas, and wherein the fin portions have a horizontal top distal to the substrate and sidewalls positioned relatively vertical to the horizontal top;
gate insulators on at least the sidewalls of the fin portions;
gate conductors on the gate insulators, wherein the gate conductors are positioned only along the sidewalls of the fin portions between the cut areas, and wherein the gate conductors are insulated from the sidewalls of the fin portions by the gate insulators;
a gate contact on the gate conductors, wherein the gate contact is positioned over a center of the fin portions along the horizontal top and extends to the gate conductors; and
source/drain structures on the fin in the cut areas.

16. The apparatus according to claim 15, wherein the gate conductors extend a distance from each sidewall of the fin portions equal to a width of the fin portions.

17. The apparatus according to claim 15, wherein the gate conductors extend a first distance from one sidewall of the fin portions and extend a second distance from an opposite sidewall of the fin portions.

18. The apparatus according to claim 15, wherein the cut areas have a cut length along the fin centerline, and wherein the cut length is less than a width of the fin portions.

19. The apparatus according to claim 15, wherein the gate insulators and the gate conductors are over a full amount of the fin portions, and wherein the gate contact is over less than the full amount of the fin portions.

20. The apparatus according to claim 15, wherein the center of the fin portions is equidistant between the cut areas.

* * * * *